(12) United States Patent
Bradley

(10) Patent No.: US 6,888,342 B2
(45) Date of Patent: May 3, 2005

(54) SPECTRUM ANALYZER AND VECTOR NETWORK ANALYZER COMBINED INTO A SINGLE HANDHELD UNIT

(75) Inventor: Donald A. Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 400 days.

(21) Appl. No.: 09/947,188

(22) Filed: Sep. 4, 2001

(65) Prior Publication Data

US 2002/0097036 A1 Jul. 25, 2002

Related U.S. Application Data

(60) Provisional application No. 60/230,172, filed on Sep. 1, 2000.

(51) Int. Cl.[7] .............................................. G01R 23/00
(52) U.S. Cl. .................................. 324/76.19; 324/76.22
(58) Field of Search ............................ 324/76.19, 76.41, 324/76.43, 76.53, 621, 623, 630, 650, 76.22; 330/149; 702/76

(56) References Cited

U.S. PATENT DOCUMENTS

| | | | | |
|---|---|---|---|---|
| 3,617,882 A | * | 11/1971 | Ishikawa et al. | 324/76.31 |
| 5,117,377 A | * | 5/1992 | Finman | 703/2 |
| 5,642,039 A | * | 6/1997 | Bradley et al. | 324/76.53 |
| 6,177,836 B1 | * | 1/2001 | Young et al. | 330/43 |
| 6,370,484 B1 | * | 4/2002 | Gorin et al. | 702/66 |
| 6,392,397 B1 | * | 5/2002 | Thomas | 324/76.11 |
| 6,417,703 B1 | | 7/2002 | Bradley | 327/105 |
| 6,483,719 B1 | * | 11/2002 | Bachman | 361/816 |
| 6,529,844 B1 | * | 3/2003 | Kapetanic et al. | 702/85 |
| 6,549,862 B1 | * | 4/2003 | Huang et al. | 702/77 |
| 6,643,607 B1 | * | 11/2003 | Chamberlain et al. | 702/170 |
| 2001/0024117 A1 | * | 9/2001 | Kiyokawa et al. | 324/76.49 |

* cited by examiner

*Primary Examiner*—N. Le
*Assistant Examiner*—Walter Benson
(74) *Attorney, Agent, or Firm*—Fliesler Meyer, LLP

(57) ABSTRACT

A spectrum analyzer is combined with the VNA in a housing measuring approximately 4 pounds with the spectrum analyzer portion operating from slightly above DC to above 3.0 GHz. The components for the spectrum analyzer are provided on a separate printed circuit board from the two printed circuit boards for the display and VNA components in the housing. The design of components for the printed circuit board enable a significant reduction of size from a typical spectrum analyzer which weighs 40 pounds or more and measures on the order of 2 feet by 3 feet by 0.5 feet.

8 Claims, 7 Drawing Sheets

US 6,888,342 B2

SPECTRUM ANALYZER AND VECTOR NETWORK ANALYZER COMBINED INTO A SINGLE HANDHELD UNIT

CROSS-REFERENCE TO PROVISIONAL APPLICATION

This Patent Application claims the benefit of Provisional Application No. 60/230,172 filed Sep. 1, 2000.

BACKGROUND OF THE INVENTION

1. Field of the Invention

The present invention relates generally to spectrum analyzers with components configured to reduce weight and overall size. More particularly, the present invention relates to such a spectrum analyzer used in conjunction with a Vector Network Analyzer (VNA).

2. Background

Recently a handheld vector network analyzer (VNA) was developed by Anritsu Corporation as described in U.S. Pat. No. 5,642,039. The handheld VNA is available from Anritsu under the trademark Site Master™. As described in U.S. Pat. No. 5,642,039 the handheld VNA is provided in a housing with dimensions of approximately 8 inches by 6 inches by 2½ inches and a weight of less than three pounds, including batteries, with a test signal from 25 MHz to 3.3 GHz. The handheld VNA includes two printed circuit boards, one for controlling the display and another for circuit components of the VNA itself.

The handheld VNA functions are beneficial. But, it is sometimes desirable when testing components where larger test equipment is difficult to manage to use the handheld VNA in conjunction with a spectrum analyzer. In particular, when testing cellular telephone base stations, it is desirable to determine if appropriate signal frequencies are provided from the base station to cellular phones, in addition to using a VNA to verify components of the base station are functioning properly. A spectrum analyzer, like a traditional VNA is typically a large unit, and may weigh 40 pounds or more and measure greater than three feet on a side. The spectrum analyzers are typically transported by truck to the remote cell phone base station sight and carried by two people to the base station. Transportation of the large spectrum analyzers can prove especially difficult.

SUMMARY

In accordance with the present invention, a spectrum analyzer is combined with the VNA in a housing measuring approximately the same as the handheld VNA described in U.S. Pat. No. 5,642,039. The entire device weighs approximately 4 pounds with the spectrum analyzer portion operating from slightly above DC to over 3.0 GHz. The components for the spectrum analyzer are provided on a separate printed circuit board from the two printed circuit boards for the display and VNA components in the housing. The design of components for the printed circuit board enable a significant reduction of size from a typical spectrum analyzer which weighs 40 pounds or more and measures on the order of 2 feet by 3 feet by 0.5 feet.

BRIEF DESCRIPTION OF THE DRAWINGS

The present invention will be described with respect to particular embodiments thereof, and references will be made to the drawings in which.

DETAILED DESCRIPTION

I. System Overview

Figure 1:
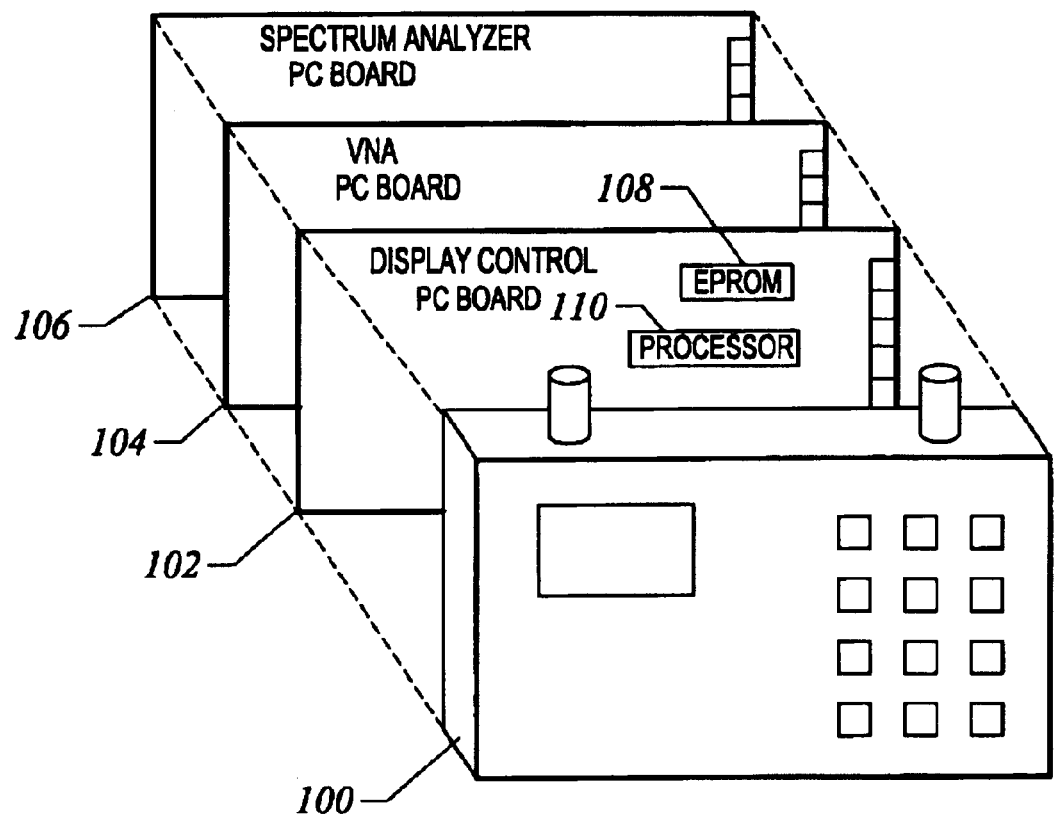
FIG. 1 shows an exploded view of components making up the combined VNA and spectrum analyzer in a handheld device.

FIG. 1 shows an exploded perspective view of a combined handheld VNA and spectrum analyzer in accordance with the present invention. The components include a housing 100 having a display and keypad, and PC boards for the display control 102, the VNA components 104, and the Spectrum Analyzer 106. Batteries and power supply are included, but are not illustrated in FIG. 1. Components which maybe used for the VNA PC board 104 are described in U.S. Pat. No. 5,642,039, incorporated herein by reference. Details of components on the spectrum analyzer PC board 106, and how those components differ from larger and heavier components typically used in a spectrum analyzer are described in detail in sections follow.

II. YIG Replacement For Limited Size, Weight and Power

The spectrum analyzer in accordance with the present invention replaces a YIG oscillator typically used with voltage controlled oscillators (VCOs). A YIG oscillator has limited phase noise and can be tuned over a wide frequency range, typically on the order of 2–20 Ghz.

Figure 2:
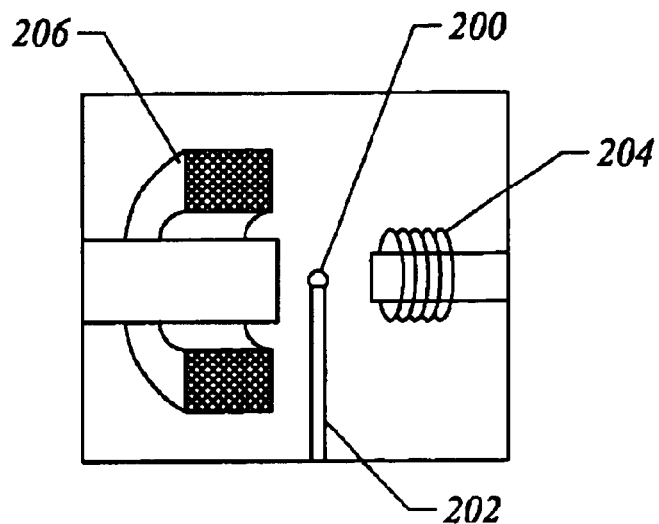
FIG. 2 illustrates typical components found in a YIG oscillator.

FIG. 2 illustrates typical components found in a YIG oscillator. The components include a YIG sphere 200 with a heating rod 202 placed near it. A small coil 204 drives the YIG sphere, and a larger coil 206 is used to control the bandwidth of the YIG oscillator. The YIG oscillator is physically large, measuring approximately 2 square inches. The oscillator additionally consumes 9 Watts of power in operation, with the heater 202 using 2 Watts, the small coil 204 1 Watt and the larger coil 206 6 Watts. VCOs used to replace the YIG oscillator are devices available on the market for placing on a printed circuit board and occupy less than a ½ inch square area each, but sacrifice some of the bandwidth and phase noise elimination relative to the YIG oscillator. Each VCO used in accordance with the present invention is a 5 volt, 50 mA device which bums a total of 150 mW each, significantly less than the 9 Watts used by the YIG oscillator. The significant drop in power consumption enables the VCOs to use less power from batteries provided on a handheld device.

III. Hi-Lo Band Paths For Spectrum Analyzer Input

Figure 3:
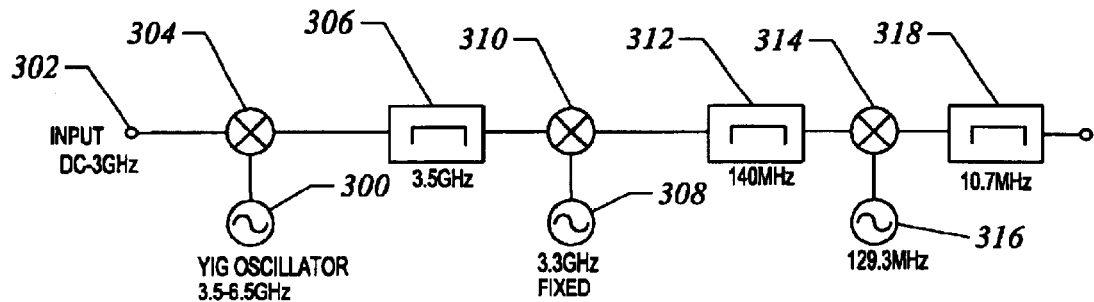
FIG. 3 illustrates a typical input configuration for a spectrum analyzer using a YIG oscillator.

FIG. 3 illustrates the typical input configuration for a spectrum analyzer operating over a DC-3 GHz range using a YIG oscillator 300 as a first LO for upconversion. The DC-3 GHz input signal is provided at input 302 to a mixer 304 for upconversion along with the 3.5–6.5 GHz YIG signal. The YIG oscillator frequency is varied to create a 3.5

GHz IF signal at the output of mixer 304. A bandpass filter 306 with a center frequency shown at 3.5 GHz eliminates images outside a narrow range around 3.5 GHz. The output of filter 306 is provided with the output of an oscillator 308 operating as a second LO at 3.36 GHz to a mixer 310 to downconvert the 3.5 GHz IF signal from filter 306 to a second IF signal of approximately 140 MHz. The second IF is then filtered through bandpass filter 312 centered at 140 MHz. The output of the filter 312 is then provided to a mixer 314 with a 129.3 MHz oscillator 316 to provide a further downconversion to a 10.7 MHz test signal which is filtered through a 10.7 MHz bandpass filter 318.

Figure 4:
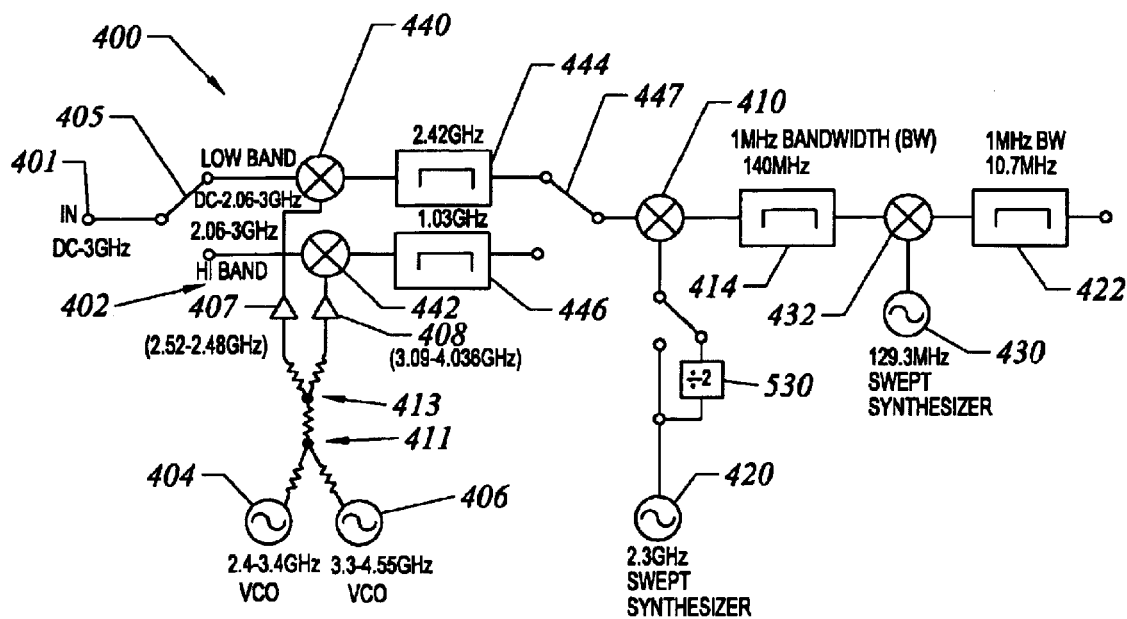
FIG. 4 illustrates basic components for an input portion for a spectrum analyzer in accordance with the present invention.

FIG. 4 illustrates basic components for an input portion for a spectrum analyzer in accordance with the present invention. The spectrum analyzer input 401 receives a signal ranging from DC-3 GHz which is applied to a switch 405. A YIG oscillator typically used in a spectrum analyzer is replaced by two VCOs 404 and 406. Although two VCOs 404 and 406 are used, more VCOs could be used with additional signal paths to create a greater operation range. Similarly, only one VCO could be used if a limited frequency range is desired.

Since the frequency operation range for the two VCOs 404 and 406 used to replace the YIG oscillator will be more limited than the YIG oscillator's range, two signal paths are provided: (1) a low band path 400; and (2) a high band path 402. An upconversion is provided from the low band path 400 using mixer 440, while a downconversion is provided from the high band path 402 using mixer 442 to eliminate reflections from the input signal.

LO signals are generated from the two VCOs 404 and 406, with a first VCO 404 shown operating from 2.4–3.4 GHz and a second VCO 406 shown operating from 3.3–4.55 GHz. A signal combiner 411 combines the signals from VCOs 404 and 406, and the combined signal is divided using a divider 413 and provided through one of a amplifiers 407 and 308 to the low band path 400 or the high band path 402. Specific frequencies are shown in FIG. 4, and subsequent drawings only for purposes of illustration. Devices operating at different frequencies could be used for the components of FIG. 4, as well as in subsequent drawings, depending on desired design requirements.

The output of amplifier 407 is provided as a low band LO to mixer 440 with a frequency ranging from 2.42 to 4.48 Ghz. The frequency of the low band LO signal is adjusted by tuning the VCOs 404 and 406 so that the low band IF signal created at the output of mixer 440 is centered at 2.42 GHz and provided through a bandpass filter 444 operating at 2.42 GHz The output of amplifier 408 is provided as a high band LO to mixer 442 with a frequency ranging from 3.09 to 4.03 Ghz. The frequency of the high band LO signal is adjusted by tuning the VCOs 404 and 406 so that the high band IF signal created at the output of mixer 434 is centered at 1.03 GHz and provided through a bandpass filter 446 operating at 1.03 GHz A switch 447 directs either the high band or low band signal to a mixer 410. A synthesizer 420 operating at 2.3 GHz generates an additional LO which is provided to mixer 410 for downconversion to a signal of approximately 140 MHz. The signal from synthesizer 420 is provided either directly to the mixer 410, or through a divide by 2 frequency divider 530, depending on whether the high band or low band signal is provided to mixer 410. The divide by 2 frequency divider 530 enables a single synthesizer 420 to be used to provide downconversion for both the high band and low band signals.

The output of the mixer 410 is applied through a bandpass filter 414 centered at 140 MHz, and another downconversion is accomplished with mixer 432 using synthesizer 430 operating at 129.3 MHz and the output of filter 414 to create a test signal centered at 10.7 MHz. The 10.7 MHz signal is then applied through bandpass filter 422 with a center frequency of 10.7 MHz, similar to the output provided from filter 318 of FIG. 3.

IV. Spectrum Analyzer Details

Figure 5A:
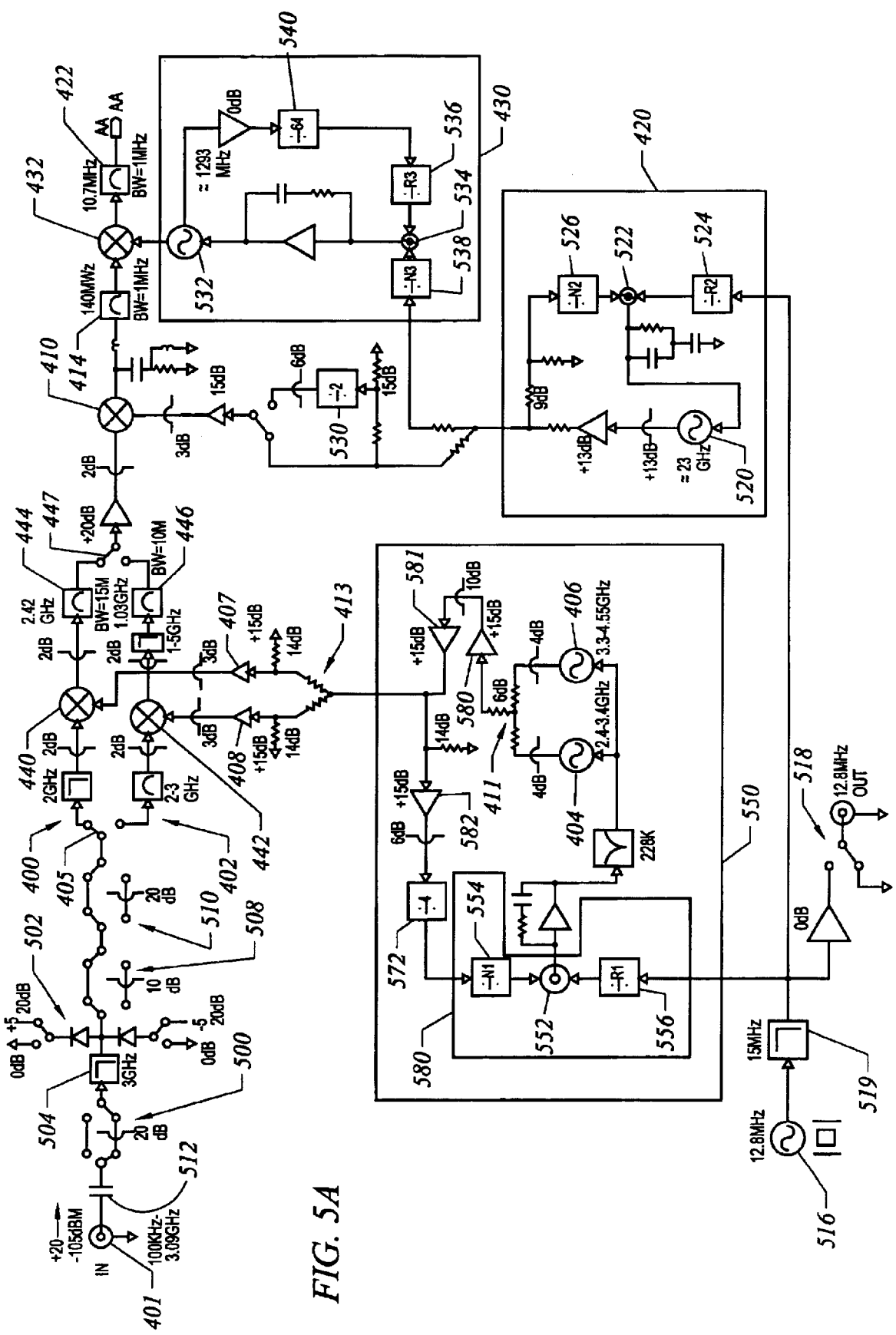
FIG. 5A illustrates more details of the spectrum analyzer input.
Figure 5B:
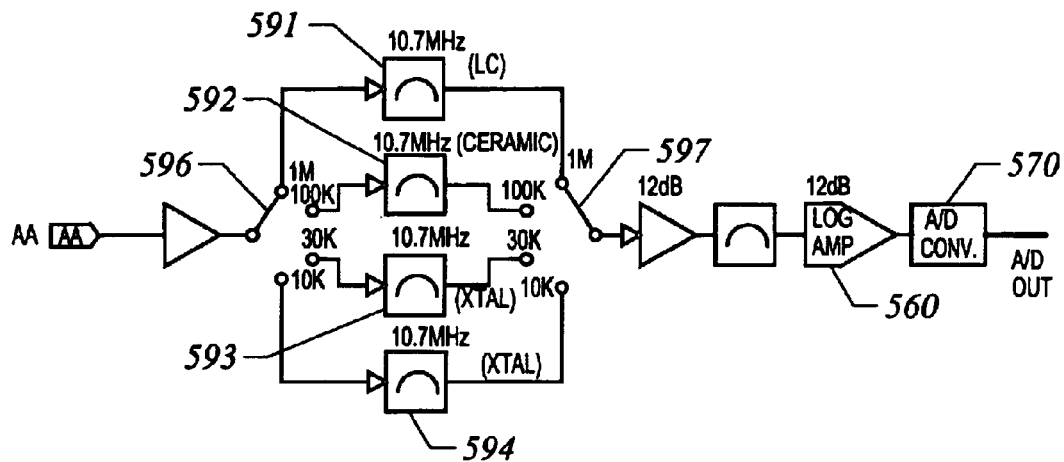
FIG. 5B shows components of the spectrum analyzer connected to the input of FIG. 5A.

FIGS. 5A and 5B show more details of components for an input to a spectrum analyzer in accordance with the present invention, including components from the more simplified input system shown in FIG. 4. The components shown in FIGS. 5A and 5B make up components used on the spectrum analyzer PC board 106 of FIG. 1. Components carried over from FIG. 4 to FIG. 5A are similarly labeled in FIG. 5A.

A. Components of FIG. 5A

1. Reference Oscillator

A crystal reference oscillator 516 operating at 12.8 MHz is preferably provided internal to the spectrum analyzer. The internal reference oscillator 516 enables the spectrum analyzer to be more mobile for use as a field testing device, unlike with typical spectrum analyzers which use an external reference having a significant size and weight.

The reference oscillator 516 signal is provided through a 15 MHz low pass filter 519 to an output 518 which provides the reference frequency signal to drive other devices. The output 518 from the reference oscillator 516 also enables synchronization of the spectrum analyzer with other devices.

2. High Resolution Fast Switching Synthesizers

The synthesizers 420 and 430 are driven by the 12.8 MHz reference oscillator 516. To reduce the number of components required for synthesizers 420 and 430, while still maintaining a high resolution with fast settling times, synthesizers are connected in a sum ratio topology. Details of connecting synthesizers 420 and 430 using a sum ratio topology are provided below. In depth information regarding connecting synthesizers in a sum-ratio topology can be found in U.S. Pat. No. 6.417.703 entitled "Frequency Synthesizer Using A Ratio Sum Topology" filed Sep. 25, 1996, and incorporated herein by reference.

The synthesizer 420 is a phase locked loop including an oscillator 520, a phase detector 522 and frequency dividers 524 and 526. The oscillator 520 has a swept output with a center frequency of 2.3 GHz. The frequency dividers 524 and 526 divide by frequencies R2 and N2, respectively, with both frequency division values varied as controlled by a control processor. The frequency divider 524 has an input driven by the reference oscillator 516.

The output of the synthesizer 420 is provided from the oscillator 520 either without further frequency division to the mixer 410 or through a divide by two frequency divider 530 similar to that described with respect to FIG. 4.

The synthesizer 430 is also a phase locked loop including an oscillator 532, a phase detector 534 and frequency dividers 536, 538 and 540. The oscillator 532 has a center frequency of 129.3 MHz which is swept similar to the oscillator of synthesizer 420. The frequency dividers 536 and 538 divide by frequencies R3 and N3 respectively as controlled by a control processor. The frequency divider 538 has a reference provided from the output of the synthesizer 420. The output of the synthesizer 430 is provided from the oscillator 532 to the mixer 432.

The ratio-sum configuration is formed by connecting the output of synthesizer 420 to drive the input of synthesizer 430, instead of using the reference oscillator 516 to drive the input of both synthesizer 420 and 430 directly. All of the values R2, N2, R3 and N3 are varied to adjust frequencies to enable increased resolution, and enable downconversion to be performed using only the two synthesizers 420 and 430. With all synthesizers referenced directly to reference 516, more synthesizers would be required to downconvert the initial IF signal to 10.7 MHz, requiring more circuitry and potentially larger, heavier oscillators, an undesirable feature for hand-held devices.

3. Components Driving VCOs

An additional phase locked loop 550 is included in FIG. 5A to control the VCOs 404 and 406. The phase locked loop 550 includes a phase detector 552 and frequency dividers 554 and 556, all in a unit labeled 580. The oscillators 404 and 406 serve as the oscillator for the phase locked loop. The input to oscillators 404 and 406 is provided from the output of phase detector 552. The output of oscillators 404 and 406 is then combined in combiner 411 and provided through amplifiers 580–582, and a divide by four frequency divider 572 back into the unit 580. The frequency divider 556 has as an input provided from reference oscillator 516. The output of the VCOs 404 and 406 are provided to mixers 440 and 442 as described with respect to FIG. 4. The frequency dividers 554 and 556 divide by frequencies N1 and R1 respectively as controlled by a control processor. Both N1 and R1 are varied to provide better resolution from the output of the phase locked loop 550, than if only one frequency were varied.

Components of a phased locked loop including the circuitry shown in box 580, as well as synthesizers 420 and 430 in FIG. 5A are available on a single chip. In accordance with the present invention, such chips are used for the components 580, as well as the phase locked loop components in synthesizers 420 and 430. Each chip occupies less than a ½ inch square area. Similar circuitry on a conventional spectrum analyzer will each occupy ½ of a 6 inch×6 inch PC board.

4. Input Protection Attenuators

In order not to saturate the mixers 440 and 442, the power level of a signal input to these mixers must stay below the range of −20 dBm to −30 dBm. Saturation will produce intermodulation products. So, for example if the input signal at input 401 is +20 dBm, attenuation is desirable. To obtain optimum performance with limited noise, if the input signal is a low level signal no attenuation is desirable. Relay type attenuators are desirable since the input 300 to the spectrum analyzer will be open to connection of signals from the outside world. The spectrum analyzer 401 input of FIG. 5A includes a relay based 20 dBm attenuator 500. The attenuator 500 can be switched between 20 dBm of attenuation and no attenuation depending on the power level of the input signal applied. The default mode of operation for the attenuator 500 is in the attenuation mode.

Because the input signal maybe higher than +30 dBm, an additional attenuation to relay attenuator 500 maybe desirable. Accordingly, the circuit of FIG. 5A includes additional relay type attenuators 508 and 510 to give different values of attenuation to assure the input signal can get below −30 dBm to prevent saturation of mixers 440 and 442.

The circuit of FIG. 5A further includes a protection limiter 502 which includes a double pole double throw (DPDT) relay. The limiter 502 either operates with the switches set to provide either 0 dBm of attenuation or +20 dBm of attenuation. The limiter 502 functions to limit power if a high power level signal is accidently applied with the spectrum analyzer in a low attenuation mode. The limiter 502 functions to reduce power by turn on of its diodes. For input protection, a traditional spectrum analyzer using a YIG oscillator would use relays throughout, and not FET switches in an input attenuator 500 along with a limiter 502 and filter 504.

When the limiting diodes of the limiter 502 are not on, they add a capacitance to the input line. The capacitance in the input line to the spectrum analyzer will alter the input line impedance from a typically desired 50Ω. The low pass 3 GHz filter 504 is used to assure the input impedance remains at 50Ω.

In contrast with a conventional spectrum analyzer, the present invention further uses a DC blocking capacitor 512 to provide input protection due to switching of the diodes of the limiter 502. With the DC blocking capacitor 512, the operation range for the spectrum analyzer is slightly higher at 100 kHz-3 GHz, as opposed to a DC-3 GHz bandwidth.

B. Components of FIG. 5B

1. Resolution Bandwidth Filters Using LC & Ceramic & Xtal vs. All Xtals

FIG. 5B includes four filters 591–594, each having a respectively narrower bandwidth. Switches enable selection of one of the filters 591–594 depending on desired test signal resolution. The four filters with switches are referred to as a resolution bandwidth filter. A conventional spectrum analyzer uses four crystal filters with different poles to form the resolution bandwidth filter. The crystal filters of a conventional resolution bandwidth filter occupy almost all of the area of a 6 inch by 6 inch printed circuit board. In accordance with the present invention, a different configuration is provided for the resolution bandwidth filter to enable it to fit within a 1 inch by 1 inch area on a printed circuit board.

In accordance with the present invention, the widest bandwidth filter 591 is an LC filter. The next widest bandwidth filter 592 is a ceramic filter. The final two filers 593 and 594 are crystal filters. A typical crystal device will have 3 pins and include two filters. For a conventional spectrum analyzer, only two of the pins are connected to enable use of only one crystal, since the use of both crystals on a single device will cause interference and create spurs. But, in accordance with the present invention, both crystals on the chip are used, and with 2 poles per device now available, two devices can be used to create a 4 pole filter, as opposed to four devices for a conventional four pole filter.

Figure 6:
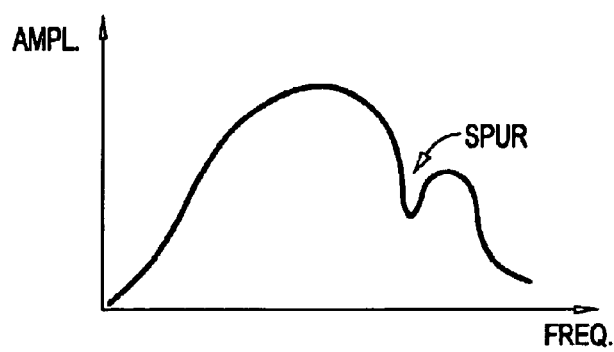
FIG. 6 shows the spurious response of a crystal filter.

The spurious response of a crystal filter is illustrated in FIG. 6. For communications on devices such as a walkie talkie for which cheaper crystals are made, the spurious response will not affect communications, but for a spectrum analyzer which requires measurement of signal strengths, the spurious response will give erroneous results. The ceramic filter 592 will avoid the spurious response, and will save more than two times the area for a typical crystal filter covering the same range. Steps are taken in accordance with the present invention, as described in more detail to follow to avoid the spurs for the crystal filters 593 and 594.

2. Log Amplifier And A/D Converter

As shown in FIG. 5B, the spectrum analyzer further includes a logarithmic amplifier 560 receiving the output from the resolution filters followed by an A/D converter 570. On conventional spectrum analyzers, the logarithmic amplifier 560 occupies ½ of the area of a 6 inch×6 inch PC board. On conventional spectrum analyzers, the A/D converter also occupies a considerable amount of space and uses a considerable amount of power, which would not be advantageous with power supplied from batteries. The configuration of the spectrum analyzer in accordance with the present invention enables both these devices to occupy less space and burn less power.

The logarithmic amplifier 560 used is an analog devices AD8307 low power unit which is provided on a single chip occupying less than a ½ inch square space on a PC board. The A/D converter 570 used is a Maxim MAX1248 device provided on an 8 pin chip which uses approximately 3.5 to 4.0 mW of power and occupies minimal space.

C. Control Processor

1. Control of N1, R1, N2, R2, N3 and R3

A control processor sets N1, R1, N2, R2, N3 and R3 depending on the input frequency to provide the necessary upconversion and downconversion. The control processor uses an iterative process to determine the values for N1, R1, N2, R2, N3 and R3 for a desired input so that the output of mixer 432 to be set at approximately 10.7 MHz. Further, frequency is controlled so that the outputs of mixers 410, 442 and 440 so that their output is within the bandwidth of the bandpass filter connected at their output. The iterative process sets initial values for N1, R1, N2, R2, N3 and R3 and then varies their values using an iterative process until desired output frequencies are reached within a desired resolution. An example of such an iterative process can be found in U.S. patent application Ser. No. 08/719,763 previously referenced herein.

The processor used to perform the iterative process to control values for N1, R1, N2, R2, N3 and R3 is the display control processor 110 provided on the display PC board 102 as shown in FIG. 1 to enable space savings. The processor 110 can be linked both to the VNA PC board 104 and the spectrum analyzer PC board 106 to function as the processor for all three boards, and conserve space. Alternatively, processors could be on all of the display PC board 102, VNA PC board 104 and the spectrum analyzer PC board 106.

2. Step & Lock vs. Lock & Roll, Software Spur Avoidance

For conventional spectrum analyzers, when measurements were made over a wide frequency range, the oscillator frequencies were stepped at intervals through the range of frequencies locking the frequency control for each oscillator at each step. Between each step, the oscillators were rolled through frequencies without locking until reaching the next frequency step. This sweep method was utilized to accommodate analog device displays which required a substantially continuous signal flow.

The present invention alters the conventional lock and roll measurement procedure to provide a step and lock procedure. The step and lock procedure is available since the display contained by the housing 100 of FIG. 1 is a LCD display and can be digitally controlled, as opposed to analog controls on conventional CRT displays. With the step and lock procedure, the oscillators are stepped through each frequency of a sweep range and locked on the frequency while measurements are made. No rolling is used.

The frequency stepping is advantageous because it enables frequency spurs which would occur in the resolution bandwidth filters to be avoided. To avoid the filter spurs, the frequency of the synthesizers 420 and 430 are adjusted to move the test signal frequency off of the frequency of the spur of a filter. The frequency ranges of the spurs of the resolution bandwidth filters, as well as other spurs throughout the system are measured when the spectrum analyzer is manufactured. Software is then set to control the control processor 110 so that the synthesizers 420 and 430 avoid the spurs. The software for control processor 110 can be stored in an EPROM 108 shown contained on the dislay control PC board 102.

The LO signals provided from synthesizers 420 and 430 are swept over a narrow range of frequencies centered at 2.3 GHz to enable elimination of noise from reflections, or spurs.

The sweep range is less than 1 MHz. A similar sweeping of signals is provided by the VNA which includes a dither line to control signal sweeping, as described in U.S. Pat. No. 5,642,039 referenced previously.

3. Calibration

The values set for the frequency dividers such as N1, N2, etc. which are supplied to control the frequency dividers, as well as power level settings for amplifiers are determined using a factory calibration process and stored in the EPROM chip 108. The EPROM chip 108 with the calibration values can be included on the display control PC board 102 to reduce the overall spectrum analyzer size, or the EPROM could be included directly on the spectrum analyzer PC board 106.

D. Isolation and Shielding

In a conventional spectrum analyzer, shielding and isolation is provided using a heavy aluminum block casting with cavities to install components. Separate cavities for each leaky component is used with cables interconnecting circuitry between the blocks to provide shielding and isolation. Such an aluminum block can have a dimension on the order of 1 square foot and weigh several pounds.

Figure 7:
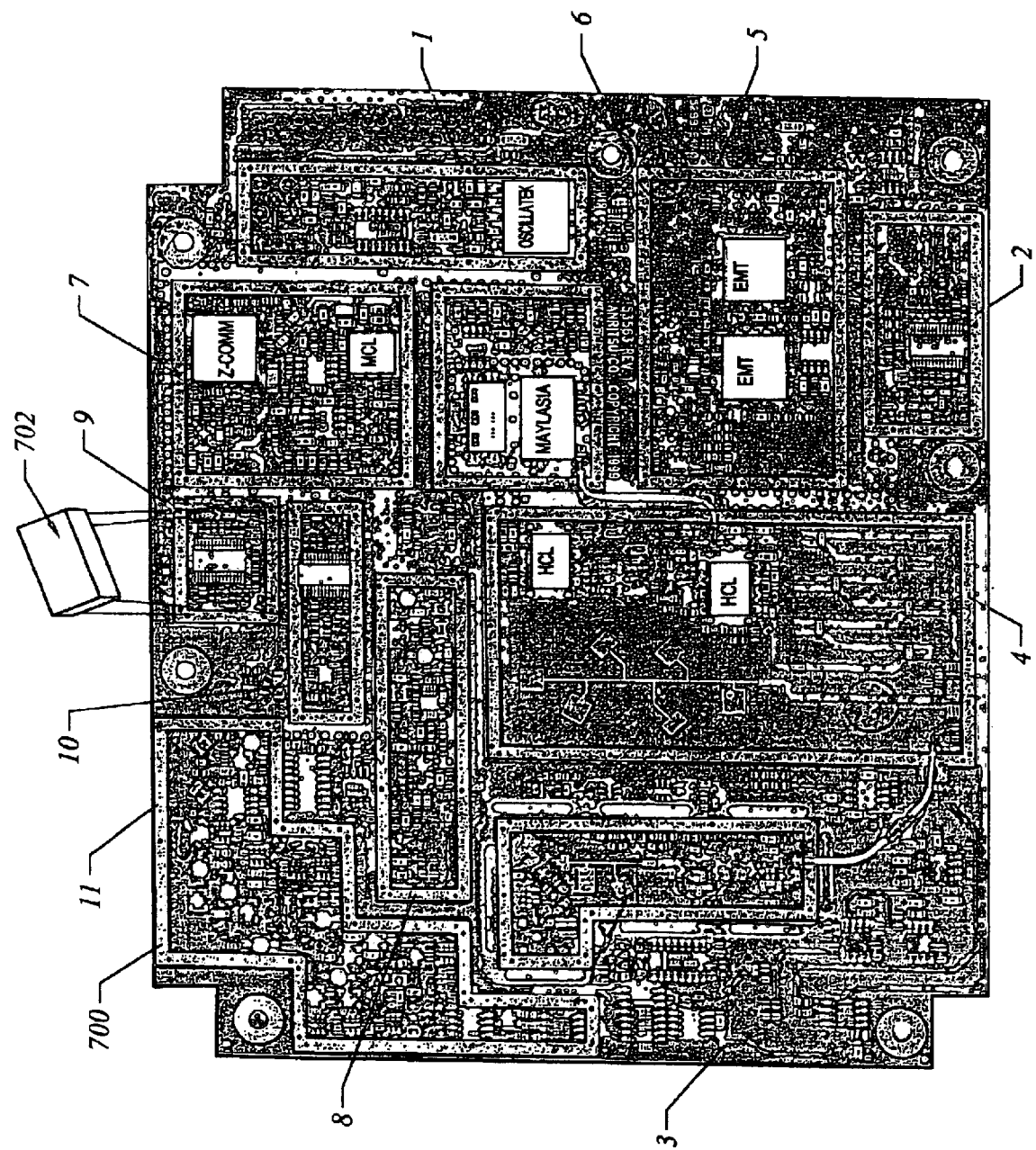
FIG. 7 shows a photocopy of a PC board with components included as described above with respect to FIGS. 5A–5B.

To provide isolation in accordance with the present invention, metal isolation lines are provided on the PC board around circuitry containing each leaky component with a brass can cover soldered to each line. FIG. 7 is a photocopy of a PC board with components included as described above with respect to FIGS. 5A–5B. The isolation lines, such as 700, are shown to which brass cans are soldered. A brass can 702 is illustrated. The interconnection of components is provided using lines in an imbedded layer of the PC board. Grounding to complete the isolation structure is provided using a metal layer beneath the upper layers of the PC board. The brass cans are approximately ½ inch in height over the PC board. Both weight and size are reduced with the isolation method in accordance with the present invention as opposed to using an aluminum casting with cabling for connections.

Figure 8A:
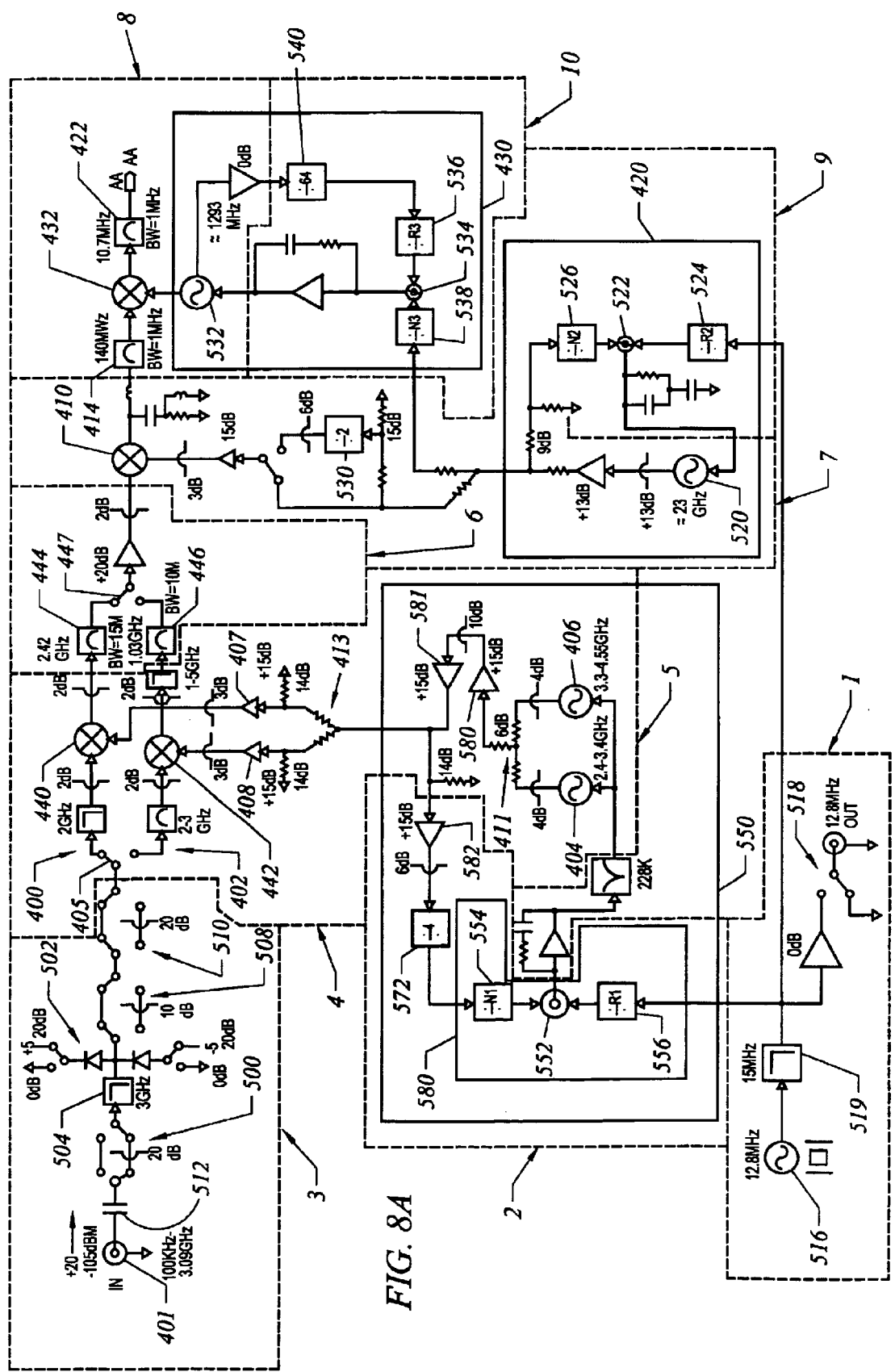
FIGS. 8A–8B are copied from FIGS. 5A–5B and include labeled blocks for identification of components on the PC board of FIG. 7.
Figure 8B:
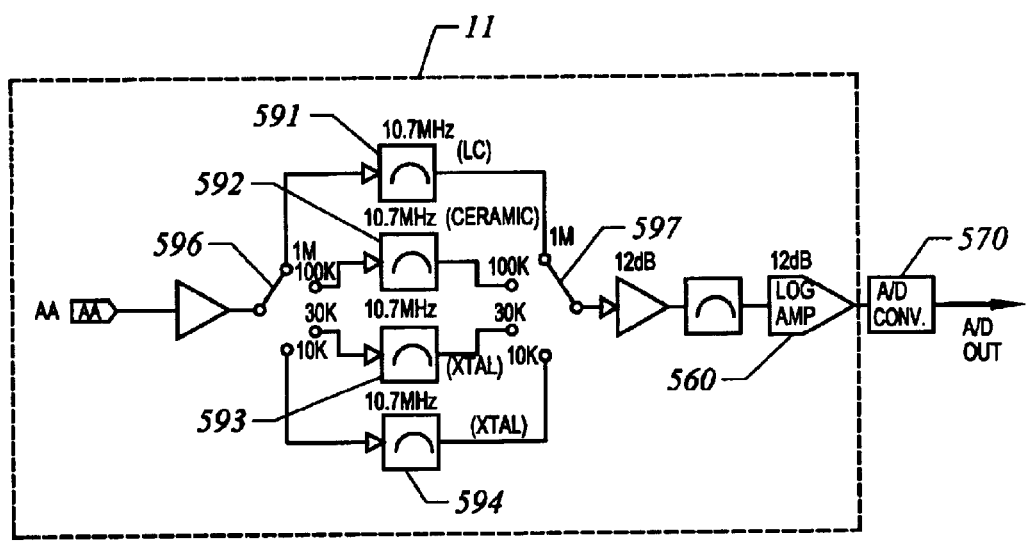

To enable comparison of the components of the PC board of FIG. 7 with the circuit diagram components of FIGS. 5A–5B, numbering 1–11 is provided in FIG. 7. Components within the areas numbered 1–11 are identified with similar labeling on FIGS. 8A–8B, FIGS. 8A–8B being copied from FIGS. 5A–5B.

V. Conclusion

With the components shown in FIGS. 5A–5B a spectrum analyzer will utilize less than 2 Watts. With less than 2 Watts consumed, cooling can be convection so no cooling fan is needed, unlike with conventional spectrum analyzers.

Although the present invention has been described above with particularity, this was merely to teach one of ordinary skill in the art how to make and use the invention. Many other modifications will fall within the scope of the invention, as that scope is defined by the claims provided to follow.

What is claimed is:

1. An apparatus comprising:

a housing; and a spectrum analyzer having components provided on a PC board contained within the housing, the spectrum analyzer components comprising:

a first voltage controlled oscillator (VCO)(404) operating over a first frequency range having an output;

a second VCO (406) operating over a second frequency range different from the first frequency range having an output;

a signal combiner (411) having a first input coupled to the first VCO, a second input coupled to the second VCO and an output;

a signal divider (413) having an input coupled to the output of the signal combiner, a first output and a second output;

a first switch (405) having a common terminal providing a signal input to the spectrum analyzer, a first switching terminal for coupling to a low band path, and a second switching terminal for coupling to a high band path;

a first mixer (440) having a first input coupled to the first output of the signal divider, a second input coupled to the low band path, and having an output;

a second mixer (442) having a first input coupled to the second output of the signal divider, a second input coupled to the high band path, and having an output;

a first bandpass filter (444) having an input coupled to the output of the first mixer and having an output;

a second bandpass filter (446) having an input coupled to the output of the second mixer and an output;

a second switch (447) having a first switching terminal coupled to the output of the first bandpass filter, a second switching terminal coupled to the output of the second bandpass filter, and having a common terminal;

a first baseband downconverter having an input coupled to the common terminal of the second switch and having an output;

a second baseband downconverter having an input coupled to the output of the first baseband downconverter and having an output; and an A/D converter (570) having an input coupled to the output of the second downconverter and an output for providing an output from the spectrum analyzer.

2. The apparatus of claim 1, wherein the spectrum analyzer components further comprise:

a crystal reference oscillator (516), and wherein the first baseband downconverter comprises:

a first baseband mixer (410) having a first input coupled to the output of the second switch, a second input and an output;

a first signal synthesizer (420) comprising:

a first divide by R frequency synthesizer (524) having an input coupled to the reference oscillator, and having an output;

a first divide by N frequency synthesizer (526) having an input and an output;

a first synthesizer VCO (520) having an output coupled to the input of the first divide by N frequency divider and to the second input of the first baseband mixer, and having a control input; and a first phase detector (522) having a first input coupled to the output of the first divide by N frequency divider, a second input coupled to the output of the first divide by R frequency divider and an output coupled to the control input of the first synthesizer VCO, and wherein the second baseband downconverter comprises:

a second baseband mixer (432) having a first input coupled to the output of the first baseband mixer, a second input and an output;

a second signal synthesizer (430) comprising:

a second divide by N frequency synthesizer (538) having an input coupled to the output of the first synthesizer VCO, and having an output;

a second divide by R frequency synthesizer (536) having an input and an output;

a second synthesizer VCO (532) having an output coupled to the input of the second divide by R frequency divider and to the second input of the second baseband mixer, and having a control input; and a second phase detector (534) having a first input coupled to the output of the second divide by N frequency divider, a second input coupled to the output of the first second by R frequency divider and an output coupled to the control input of the second synthesizer VCO.

3. The apparatus of claim 2, wherein the first VCO and the second VCO have control inputs, and wherein the spectrum analyzer components further comprise:

a third signal synthesizer (550) including the first and second VCO (404,406) and the signal combiner (411), the third signal synthesizer further comprising:

a third divide by R frequency synthesizer (556) having an input coupled to the reference oscillator, and having an output;

a third divide by N frequency synthesizer (554) having an input coupled to the output of the signal combiner and an output; and a third phase detector (552) having a first input coupled to the output of the third divide by N frequency divider, a second input coupled to the output of the third divide by R frequency divider and an output coupled to the control input of the first VCO and the second VCO.

4. The apparatus of claim 3, further comprising:

resolution bandwidth filters comprising:

a first filter switch (596) having a common terminal coupled to the output of the second baseband downconverter, a first switching terminal and a second switching terminal;

a second filter switch (597) having a common terminal coupled to the input of the A/D converter, a first switching terminal and a second switching terminal;

a first crystal filter (593) coupled between the first switching terminals of the first and second filter switches;

a second crystal filter (594) coupled between the second switching terminals of the first and second filter switches, the first and second crystal filters being included on a single integrated circuit chip.

5. The apparatus of claim 4, further comprising:

a processor (110) coupled to the first, second and third divide by R frequency dividers, and to the first, second and third divide by N frequency dividers for controlling frequency division values, the processor controlling the frequency division values to avoid a signal frequency provided to the first and second crystal filters from occurring in a frequency spur.

6. The apparatus of claim 1, further comprising:

relay based attenuators (500, 508, 510) coupled in series between the input of the spectrum analyzer and the common terminal of the first switch, the relay attenuators comprising:

a first switch having a common terminal forming the input of the relay attenuator, a first switching terminal and a second switching terminal;

a second switch having a common terminal forming the output of the relay attenuator, a first switching terminal and a second switching terminal;

a through line coupled between the first switching terminals of the first and second switches; and an attenuator coupled between the second switching terminals of the first and second switches;

a limiter (502) comprising:
a diode having a first terminal coupled to the common terminal of the first switch, and a second terminal;
a limiter switch having a common terminal coupled to the second terminal of the diode, a first switching terminal coupled to a first voltage potential, and a second switching terminal coupled to a second voltage potential offset from the first voltage potential; and a DC blocking capacitor (512) coupled between the input of the spectrum analyzer and the relay attenuators.

7. An input signal attenuators for a spectrum analyzer comprising:
relay based attenuators (500, 508, 510) coupled in series between the input of the spectrum analyzer and a first frequency converter, the relay based attenuators each comprising:
a first switch having a common terminal forming the input of the relay based attenuator, a first switching terminal and a second switching terminal;
a second switch having a common terminal forming the output of the relay based attenuator, a first switching terminal and a second switching terminal;
a through line coupled between the first switching terminals of the first and second switches; and
an attenuator coupled between the second switching terminals of the first and second switches;

a limiter (502) comprising:
a diode having a first terminal coupled to the input of the spectrum analyzer, and a second terminal;
a limiter switch having a common terminal coupled to the second terminal of the diode, a first switching terminal coupled to a first voltage potential, and a second switching terminal coupled to a second voltage potential offset from the first voltage potential; and a DC blocking capacitor (512) coupled between the input of the spectrum analyzer and the converter.

8. Resolution bandwidth filters for a spectrum analyzer, the resolution bandpass filters comprising:
a first filter switch (596) having a common terminal coupled to an output of a baseband downconverter, a first switching terminal and a second switching terminal;
a second filter switch (597) having a common terminal coupled to an A/D converter, a first switching terminal and a second switching terminal;
a first crystal filter (593) coupled between the first switching terminals of the first and second filter switches; and
a second crystal filter (594) coupled between the second switching terminals of the first and second filter switches, the first and second crystal filters being included on a single integrated circuit chip.

* * * * *